United States Patent [19]

Leitz et al.

[11] Patent Number: 5,119,536
[45] Date of Patent: Jun. 9, 1992

[54] PROGRAMMABLE ELECTRONIC COMPONENT ASSEMBLY SYSTEM

[76] Inventors: Gerald F. Leitz, 51 Sherry La., New Milford, Conn. 06776; Istvan Priscsak, 66 Shortwoods Rd., New Fairfield, Conn. 06812

[21] Appl. No.: 534,541

[22] Filed: Jun. 7, 1990

[51] Int. Cl.⁵ .............................................. H05K 3/30
[52] U.S. Cl. ................................. 29/566.3; 29/703; 29/705; 29/741
[58] Field of Search ............... 29/566.3, 741, 739, 29/703, 705, 838, 564.1

[56] References Cited

U.S. PATENT DOCUMENTS

| | | | |
|---|---|---|---|
| 3,907,008 | 9/1975 | Bates et al. | 29/566.3 X |
| 3,986,533 | 10/1976 | Woodman, Jr. | 29/566.3 X |
| 4,165,557 | 8/1979 | Taguchi et al. | 29/566.3 |
| 4,377,026 | 3/1983 | Whitley | 29/564.1 |
| 4,447,945 | 5/1984 | Priscsak | 29/566.3 |
| 4,622,740 | 11/1986 | Mirley, Jr. et al. | 29/741 X |
| 4,635,341 | 1/1987 | Staudinger | 29/566.3 |

Primary Examiner—Z. R. Bilinsky

[57] ABSTRACT

A semiautomatic machine for assembling components on a printed circuit board in which the components may have leads of different sizes, materials and diameters. The leads are automatically cut and bent in accordance with a predetermined program without stopping the operation of the assembly or restoring to manual adjustments.

15 Claims, 6 Drawing Sheets

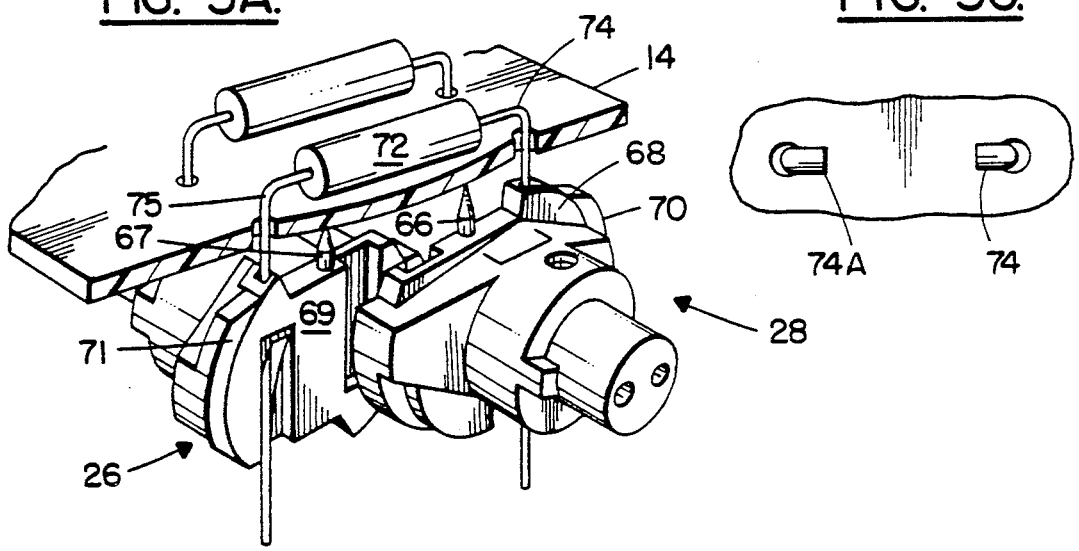
FIG. 3A.
FIG. 3C.
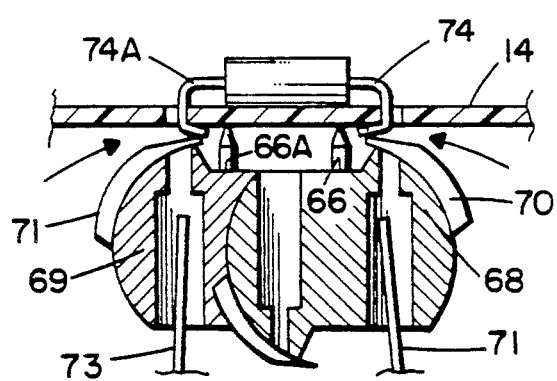
FIG. 3B.
FIG. 4C.
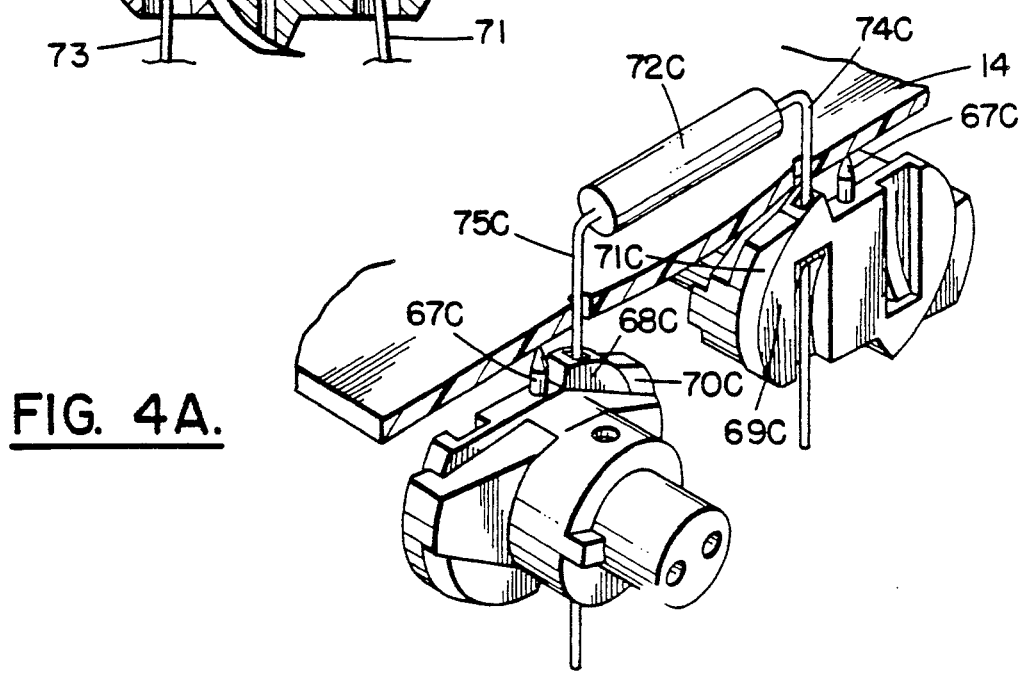
FIG. 4A.

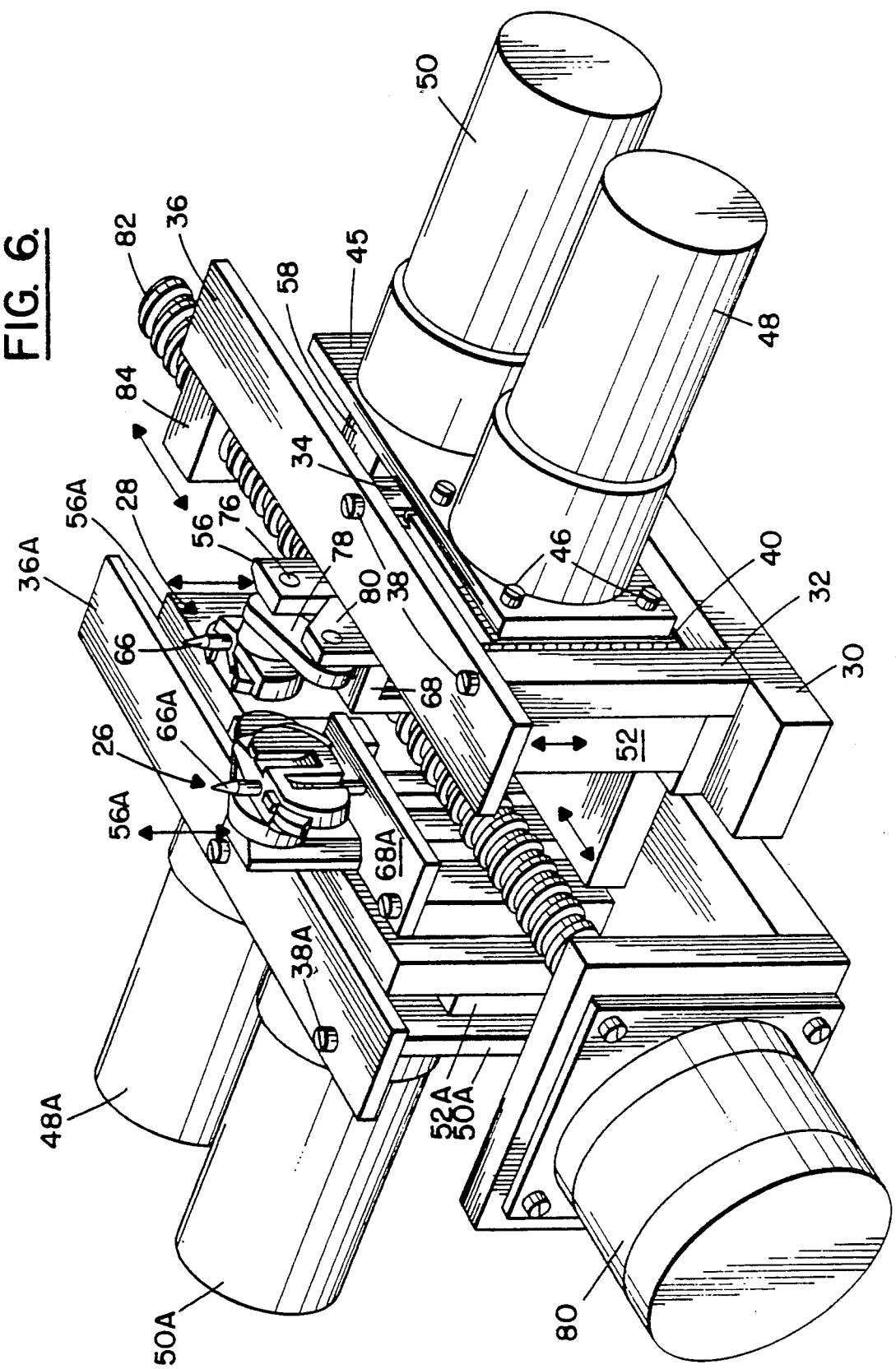

PROGRAMMABLE ELECTRONIC COMPONENT ASSEMBLY SYSTEM

BACKGROUND OF THE INVENTION

1. Field of the Invention

The present invention relates generally to an electronic component assembly system with various programmable adjustable features. More specifically, the invention relates to a semi automatic machine for assembling electronic components on a printed circuit board in which the leads of the components pass through the board and are cut and clinched underneath. Thereafter the component leads are wave soldered under the board to complete the printed circuit.

2. Description of the Prior Art

A prior art assembly system to which the present invention relates is marketed by Contact Systems Inc. and known as the CS-400C Component Locator with Automatic Cut and Clinch. This system provides a console in which an operator sequentially manually picks electronic circuit components from a supply such as a rotary bin and individually places them on work pieces such as circuit boards. The system includes an X-Y table that positions the board for receipt of each circuit component. A projector located above the X-Y table provides two spots of light on the board to indicate to the operator the location where the component is to be inserted. The dual spot remains in one position and the X-Y table is programmed to travel to a new location for placement of the next component. The programmed position of the table brings to the dual spot the next succeeding position on the circuit board to receive the designated component.

The operator manually picks out components from the supply in the proper sequence in which they are to be placed on the circuit board and inserts each component in its predesignated position. The source of components and the X Y table are preprogrammed so that when a particular component is positioned for operator selection the corresponding location for it on the printed circuit board is under the dual spot light source. After the component is inserted on the board the operator activates a switch as by pressing a foot pedal to activate a cut and clinch mechanism located under the X Y table which cuts and clinches the component leads.

It is understood that the various components may be of different sizes and have leads of different materials and diameters. Because of this, different components leads must be cut at different lengths and clinched at different angles appropriate for the diameter and other characteristics of the particular lead. A need therefore exists for adjusting the length that the various leads are cut and the angle to which they are clinched without stopping the operation of assembly and resorting to manual adjustments. This is one general problem to which the present invention is directed.

SUMMARY OF THE INVENTION

The present invention is directed to an improved cut and clinch mechanism in which the lead length and clinch angle of the leads on the different components may be adjusted to meet the requirements of the leads of the particular component. The changes or adjustments are preprogrammed so that the assembly operation can continue without interruption. This is done by controlling the location of the lead cutters in relation to the underside of the printed circuit board and also controlling the sweep of the cutter blade. Both of these are under the control of a suitable processor unit which has been programmed in accordance with the sequence in which the various components are assembled on the work piece or printed circuit board.

Accordingly, it is a primary object of the present invention to provide a semiautomatic assembly machine of a cut and clinch type in which the length of the lead cut and the clinch angle may be conveniently adjusted.

Another object of the present invention is to provide a cut and clinch assembly system in which the lead length of the components and clinch angle may be automatically adjusted from one component to another without interrupting the assembly operation.

Another object of the present invention is to provide a cut and clinch assembly system in which the lead length of the individual components and their corresponding clinch angle may be preprogrammed for automatic operation.

A further object of the present invention is to provide a circuit board component assembly system that is conveniently adjustable and efficient in operation.

A further object of the invention is to test the electrical component at the time that it is inserted into the circuit board.

A still further object of the invention is to provide for testing the component's electrical characteristics and its proper placement in the circuit board.

BRIEF DESCRIPTION OF THE DRAWINGS

The foregoing and still other objects and advantages of the present invention will be more apparent from the following detailed explanation of the preferred embodiments of the invention in connection with the accompanying drawings herein in which:

FIG. 3A is a perspective view of a portion of a printed circuit board showing the two cutter assemblies mounted thereunder;

FIG. 3B is a side view of FIG. 3A showing the cutter assemblies with the movable cutters swept inward to illustrate an inward clinch of the component leads;

FIG. 3C is an underside view of the circuit board showing the inwardly clinched leads;

FIG. 4A is a perspective view similar to FIG. 3A but with the cutter assemblies reversed and the movable cutters in a position for an outward clinch of the component leads;

FIG. 4C is an underside view of the circuit board showing the outwardly clinched leads;

FIG. 6 is a perspective view of the cut and clinch mechanism of the present invention;

DESCRIPTION OF A SPECIFIC EMBODIMENT

Figure 1:
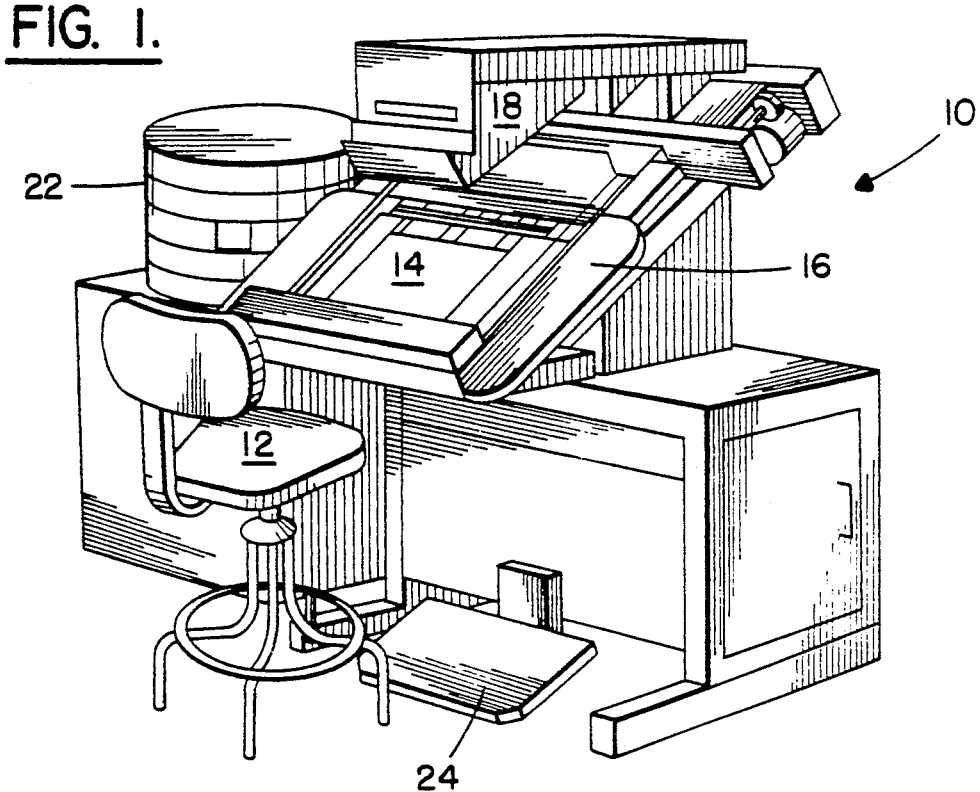
FIG. 1 is a perspective view of the assembly system of the present invention showing the operator console.
Figure 2:
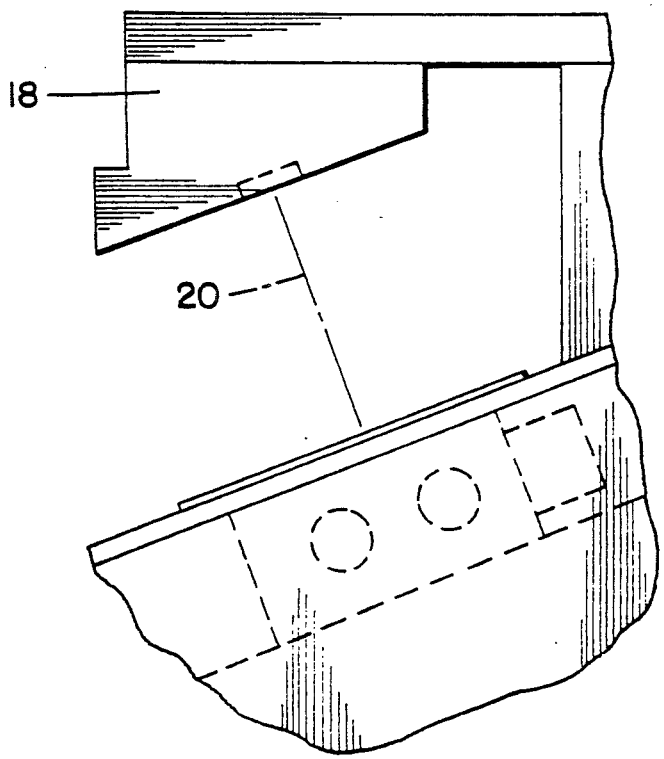
FIG. 2 is a side view of a portion of FIG. 1 showing the dual light projector shining onto the circuit board.

Referring now to FIG. 1 there is shown an assembly console 10, including a chair 12 at which an operator may sit in performing the assembly operation of placing circuit components on a printed circuit board 14. The board is mounted on a conventional X-Y table 16 which is preprogrammed to travel to bring the appropriate mounting position on the board to the component mounting location. A projector 18 provides a dual light beam 20 that impinges upon the printed circuit board and indicates to the operator the mounting location for the individual components. It is understood that the dual light spots are projected onto the target holes in the printed circuit board and that the board is sequentially positioned to bring the target holes to the light spot location. The component supply may take various forms and in FIG. 1 is shown to be a rotary bin 22 which presents one component for each cycle of the apparatus. The bin is appropriately programmed to sequentially bring the appropriate component to the pick-up location for the operator.

After a component is inserted in its appropriate openings in the printed circuit board the operator will activate foot pedal 24 which closes a switch to initiate a cycle of operation. The component will be cut, clinched and tested as hereinafter described and if the test is positive, the x-y table will move the mounted circuit board to the next position to receive the next succeeding component.

The cut and clinch mechanism is shown in FIG. 6 and consists of two cutter assemblies, a fixed assembly 26 and a movable assembly 28.

Each of the cutter assemblies is similarly mounted to be raised and lowered under the control of a respective programmable lifter motor as hereinafter described.

Figure 8:
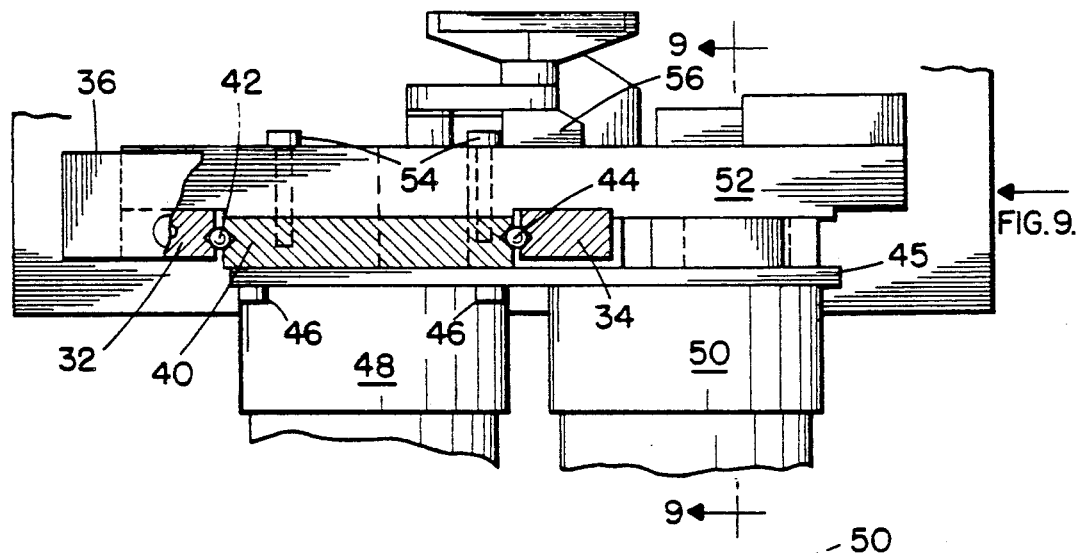
FIG. 8 is a top view partially in section along the line 8—8 of FIG. 7.

The cutter assembly mounting arrangement will be described with reference to FIGS. 6 through 9 where it is seen that a base plate 30 is provided having two upstanding posts 32, 34. A top plate 36 is secured in place to the upper ends of the posts as by screws 38. Located between the posts 32, 34 is a vertically slidable mounting plate 40 as seen in FIG. 8. The outer sides of the mounting plate 40 and inner sides of posts 32, 34 are grooved to receive ball bearings 42, 44 which permit the mounting plate to smoothly slide vertically between the stationary posts. Motor mounting bracket 45 is secured to the outer surface of the mounting plate 40 by means of screws 46 and a pair of motors 48, 50 are secured to the bracket 45. As will be described hereinafter, motor 48 serves to operate a movable cutter of cutter assembly 28 and motor 50 operates to raise and lower the cutter assembly.

An inside mounting plate 52 is secured to the vertical mounting plate 40 as by screws 54 so that the inside mounting plate will be vertically movable to follow the movement of plate 40. Vertically disposed cutter mount 56 is secured to member 52 and serves as a mounting bracket for the cutter assembly 28.

Figure 10:
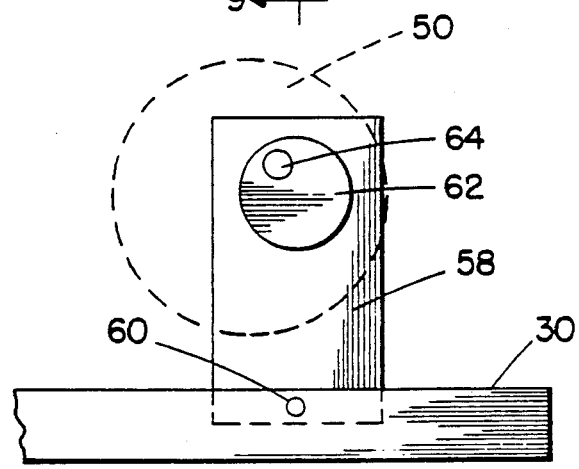
FIG. 10 is a side view illustrating the assembly lifter mechanism.

Referring now to FIG. 10, it is seen that there is a vertically disposed plate 58 pivotally mounted to base 30 as at 60. The plate has an opening 62 that receives the shaft of lifter motor 50 which in turn has an eccentric pin 64. Because the plate 58 is secured to the base, it will not move vertically and thus rotation of the lifter motor shaft will result in the motor moving upward or downward. Because the motor is secured to bracket 45, the latter will move with the motor and correspondingly move mounting plate 40 upward or downward. This vertical motion will be transferred to the cutter assembly 28 through inside mounting plate 52 and cutter mount 56. Thus it is seen that by applying rotation to the lifter motor shaft the cutter assembly is raised or lowered through the above described linkage mechanism.

In a similar manner, the cutter assembly 26 is raised or lowered under the control of lifter motor 50A. The mechanical linkage elements above described in connection with cutter assembly 28 are duplicated in regard to cutter assembly 26 and corresponding elements have the same numbers as above described with the designation A and operate in the same manner. Cutter assembly 28 has a vertical hole passing therethrough which receives a standoff pin 66 adapted to slide within the cutter assembly hole. A standoff pin bracket 68 which supports the standoff pin 66 is secured to base plate 29 which prevents vertical movement of pin 66. As seen in FIG. 6, the corresponding standoff bracket 68A supports standoff pin 66A of cutter assembly 26 and the lower end of the pin may be screw threaded into bracket 68A. Because the brackets 68-68A are secured to the respective base plates 29 and 29A the brackets will not move vertically with the lifter motor and associated mechanism but will be held in place in a fixed manner. Thus as a lifter motor such as 50 causes cutter assembly 28 to lift upward or descend, the standoff pin 66 being held in a fixed position, will slide within its hole in the cutter assembly. The result is that a downward movement of cutter assembly 28 will expose a greater length of standoff pin 66 and correspondingly a downward movement of cutter assembly 26 will expose a greater length of standoff pin 66A.

The operation of the cutters will be described with respect to FIGS. 3A-3C where it is seen that cutter assembly 28 has a fixed cutter 67 and a movable cutter 70. A component 72 has a lead 74 that will pass through a center hole of the fixed inner cutter 67. Similarly, component lead 75 passes through an opening in the fixed inner cutter 69 of cutter assembly 26. As the outer cutters 70 and 71 sweep inwardly, they will cut the leads 74-75 at the upper surface of fixed inner cutters 67-69. The bottom ends 73-77 of the cut leads will fall away into a suitable lead sink funnel (not shown). FIG. 3B shows the outer cutters 70-71 swept to their cut positions and the bottom ends 73-77 of leads 74-75 cut off and bent or clinched inwardly. It is understood that the upper ends of the standoff pins 66 and 66A bear against the underside of the printed circuit board 14 as seen in FIG. 3A. The inwardly bend leads are shown in FIG. 3C.

Figure 4B:
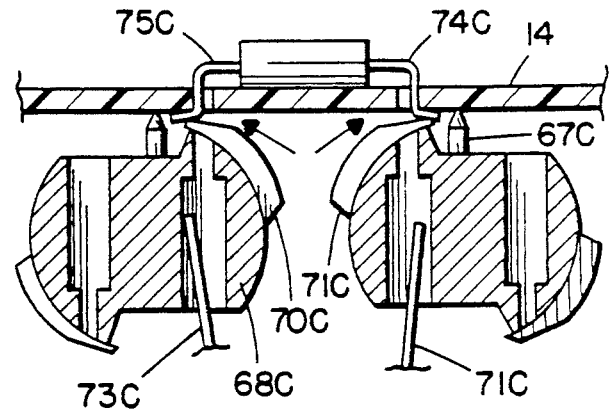
FIG. 4B is a side view of FIG. 4A showing the cutter assemblies with the movable cutters swept outward to illustrate an outward clinch of the component leads.

FIGS. 4A-4C are similar to FIGS. 3A-3C but the cutter assemblies are positioned for outward bending or clinching of the leads. The elements in FIGS. 4A-4C carry the same numbers as in FIGS. 3A-3C and it is seen that the bend in each end of the leads 74C and 75C is outward.

Referring to FIG. 3A and 6, the operation of the outer cutters 70 and 71 are under the control of cutter motors 48 and 48A respectively. The cutter assembly 28 connects to cutter mount 56 by a shaft 76 that also passes through a rocker arm 78 which in turn is pinned to link 80 that in turn is connected to the shaft of cutter motor 48. Thus as the motor operates, link 80 will reciprocate either upward or downward to actuate rocker arm 78 which in turn causes outer cutter 70 to sweep forward to cut the lead 74 that passes through the opening in the cutter assembly. In a similar manner, cutter assembly 26 is operated by cutter motor 48A. Cutter assembly 26 is said to be fixed in that it will not move laterally although as described above, it will move vertically under the control of lifter motor 50A. Cutter assembly 28, on the other hand, is designed to move laterally under the control of motor 81 which connects to lead screw 82. The latter passes through lead nut 84 secured in any suitable manner to top plate 36. Motor 81 is mounted to base plate 29A which is maintained in a fixed position. Thus the operation of motor 81 will move the assembly consisting of base member 30, top plate 36, posts 32, 34 and base plate 29 in a lateral direction which results in a change in the separation of cutter assemblies 26-28. It is, of course, understood that different components are of different sizes and hence have different separations of their respective leads. It is the lateral movement of the cutter assemblies that adjust to the lead separations of the components.

The complete mechanism is mounted on a turntable (not shown) which can rotate 360 degrees in a manner known to the prior art. The operation of the turntable is programmed to accommodate the particular component and can result in clinches that are inward, outward or sidewise in a known manner. Thus the cutter assemblies have a full range of movements to meet the requirements of component size and mounting and board design. The lead bend or clinch may be inward as shown in FIGS. 3A-3C or outward as shown in FIGS. 4A-4C.

A particularly novel feature of the present invention is that the component leads may be cut at different lengths and bent or clinched at different angles in a predetermined preprogrammable manner without stopping the operation of the machine. It is realized that different components have different lead thicknesses. It has been found that to achieve a reliable clinch angle a lead should be typically cut to a length of approximately 1.5 times its diameter. Thus, thin leads can, and therefore should be cut very short as shown in FIG. 5B. For example, the lead may be 0.018 inches in diameter and the cut length would be appropriately 0.030 inches. The lead is cut as short as possible and the clinch is sufficient to retain the component in place on the circuit board 14.

Figure 5A:
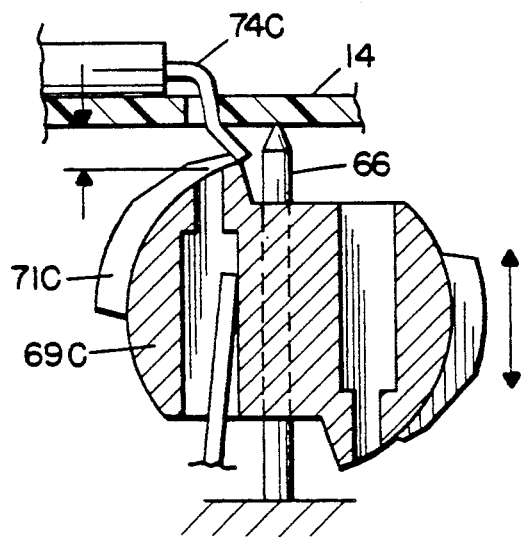
FIG. 5A is a side view of a cutter assembly and portion of a circuit board and component in which the mechanism is set for a long lead cut.
Figure 5B:
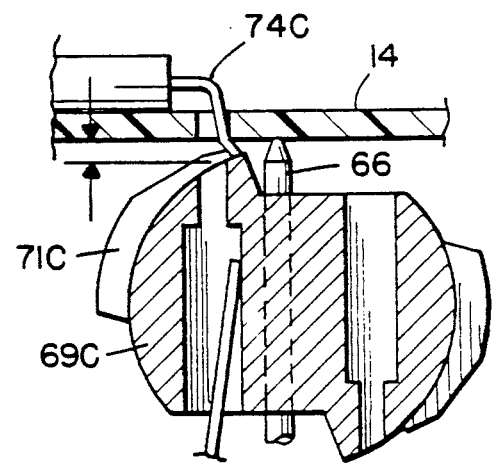
FIG. 5B is a view similar to FIG. 5A with the cutter assembly adjusted to a short lead cut.
Figure 9:
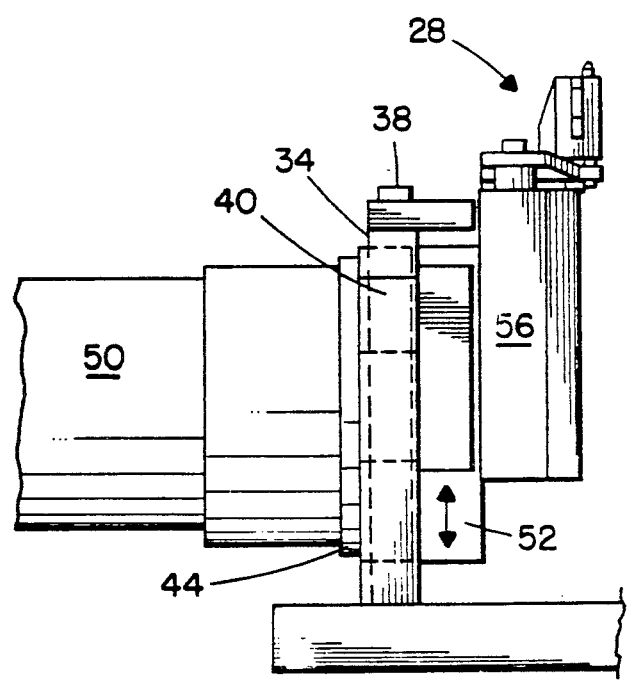
FIG. 9 is a view taken on the line 9—9 of FIG. 8.
Figure 7:
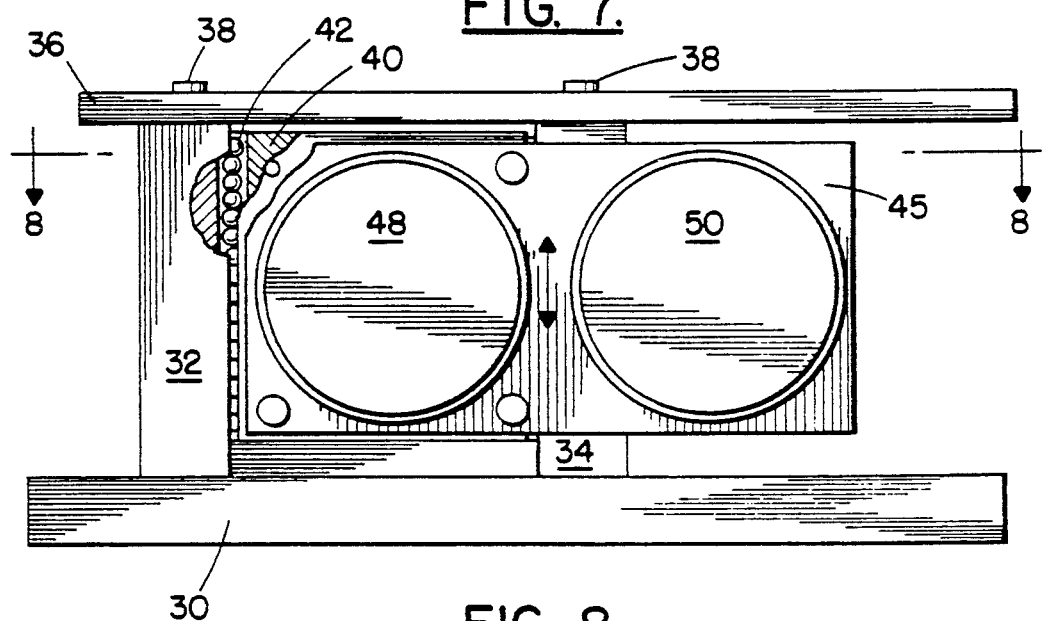
FIG. 7 is a side view of FIG. 6.

In FIG. 5A it is seen that the lead diameter is somewhat larger than in FIG. 5B and may, for example, be 0.040 inches. The cutter assembly is lowered to achieve greater length for the thicker lead and the amount of the outer cutter sweep must be increased to produce the same clinch angle. Thus, both lead length and cutter sweep must be changed to produce this ideal cut clinch setting for a 0.040 inch diameter lead.

To achieve the optimum cut and clinch the cutter assembly is programmed to move up or down for the ideal lead length and the sweep of the movable cutter is programmed to obtain the optimum clinch angle. It is understood that the clinch angle is determined by the stopping point of the movable cutter. In one embodiment of the present invention the cutter assembly was programmable to provide a lead length from 0.020 inches to 0.090 inches which as explained above is accomplished by moving the cutter assembly upward and downward.

Figure 11:
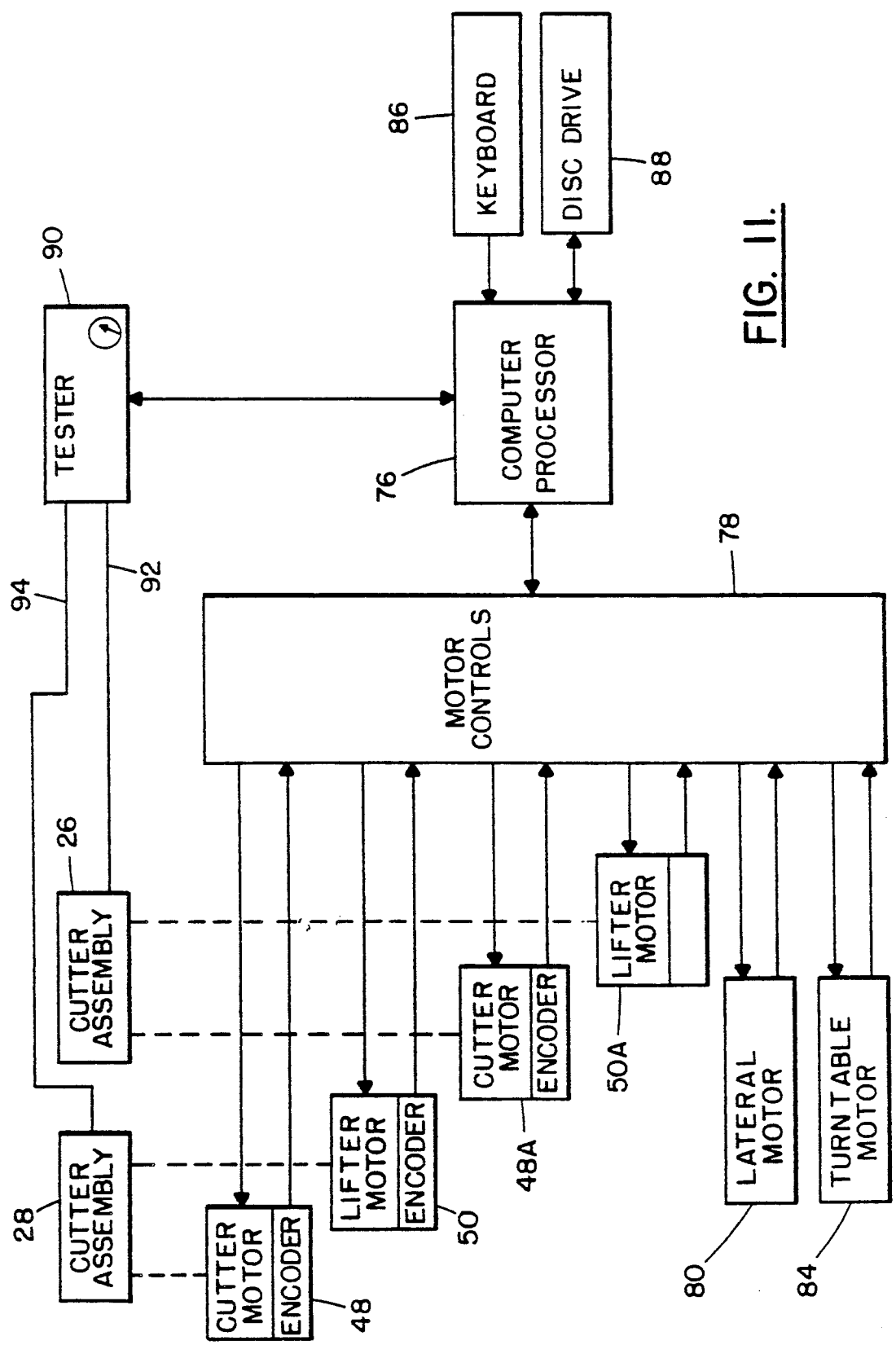
FIG. 11 is a block diagram of the cutter assemblies, processor, tester and control components of the present invention.

It is understood that a program would be developed for each circuit board design in accordance with the particular components used and mounted on the board. FIG. 11 is a block diagram illustrating the program control system. The programs may be recorded on a floppy disk that will control the processor unit 76 which through the motor controller 78 controls the cutter motors 48, 48A, lifter motors 50, 50A, lateral control motor 81, and the turntable motor 84. Each motor has an encoder to detect the motor shaft position which is fed back to the motor control unit. Shaft rotation for the cutter motors and lifter motors is a fraction of a rotation.

The computer has a keyboard 86 and a disk drive 88. The program procedure is well known and involves compiling a work sheet indicating the sequence of assembly and the various machine commands for each component. The commands are then entered into a storage device as a diskette.

Another particularly novel feature of the present invention is that of testing each component after it is inserted onto the printed circuit board. Referring again to FIG. 11 there is shown diagramatically the apparatus for this test procedure.

A tester 90 is provided, of any conventional construction, to test an electrical parameter of the component such as resistance, inductance, capacitance or diode polarity. The tester 90 is connected to the cutter assemblies 26 and 28. The processor unit that controls the programming of the various motors above described also controls the tester 90. It is understood that each component will require a particular test for its electrical parameter. The information regarding each component is appropriately stored in the diskette and the processor will activate the tester for each component and for the component's electrical parameter. Thus as the component leads are cut electrical contact is made over connectors 92, 94 and the tester will perform the test and in the case of a failure will indicate that by a light or other means. The operator will then remove the component and replace it with a substitute.

Having thus described the invention with particular reference to the preferred forms thereof, it will be obvious that various changes and modifications may be made therein without departing from the spirit and scope of the invention as defined in the appended claims.

What is claimed is:

1. A device for assembling electrical components having extending leads onto a circuit board in which the leads pass through holes in the board and are cut and clinched on the underside of the board comprising:
   cutter assembly means positioned adjacent the underside of the board including;
   cutter means positioned to cut and bend a lead passing through a board;
   said cutter means including a movable cutter blade in which the extent of movement determines the angle of bend of a cut lead;
   adjustable cutter blade moving means to move the cutter blade to cut a component lead;
   adjustable means to move the cutter means toward and away from the board whereby the distance from the underside of the board to the cutter means determines the length of a cut lead; and
   programmable means to control the adjustable cutter blade moving means to move the cutter blade to any one of a range of predetermined distances and to control the adjustable means to move the cutter means to any one of a range of predetermined distances for successive components to determine the angle of bend and the lengths of the respective component leads.

2. The device set forth in claim 1 in which the adjustable cutter blade moving means and the adjustable means to move the cutter means comprise electric motor means.

3. The device set forth in claim 2 in which the programmable means comprises computer processor.

4. The device set forth in claim 1 in which the cutter assembly includes pin means adapted to engage the underside of the circuit board.

5. The device set forth in claim 1 in which the cutter assembly means includes a first cutter assembly and a second cutter assembly;
    said second cutter assembly being mounted for lateral movement whereby the first and second cutter assemblies may be moved predetermined distances apart to accommodate different size components;
    means to laterally move the second cutter assembly; and
    means whereby said programmable means controls the means to laterally move the second cutter assembly predetermined distances for successive components to determine the distances between the first and second cutter assemblies for successive components.

6. The device set forth in claim 4 in which the pin means passes through the first cutter assembly;
    said pin means being mounted in a stationary manner with respect to the movement of the cutter assembly toward and away from the circuit board.

7. A device as set forth in claim 1 including testing means to test an electrical characteristic of the electrical components and electrical conductor means connected to the testing means and to the cutter assembly means.

8. A device as set forth in claim 7 in which the programmable means controls the testing means to measure a predetermined electrical characteristic of a predetermined sequence of electrical components.

9. A machine for assembling a predetermined series of electrical components having leads of different diameters and different spacings on to a circuit board having holes through which the leads pass and are cut and bent on the underside of the board comprising;
    a first cutter assembly and a second cutter assembly;
    each cutter assembly including;
    cutter means adapted to receive a lead passing through a circuit board to cut and bend the lead;
    a pin passing through the cutter means and fixedly mounted at the lower end and the upper end of which is adapted to bear against the underside of a circuit board;
    a cutter blade;
    first motor means to activate the cutter blade to sweep a predetermined distance to cut and bend a lead;
    second motor means to move each cutter means a predetermined distance from the upper end of its respective pin; and
    programmable means connected to each first and second motor means to activate each said first and second motor means to move each cutter means to a predetermined distance from the end of its respective pin and move each cutter blade a predetermined sweep to cut and bend the leads of successive components predetermined amounts.

10. The machine set forth in claim 9 including testing means to selectively measure a plurality of electrical parameters;
    means to electrically connect said testing means to each of said cutter assemblies whereby an electrical characteristic of a component positioned with its leads in each cutter assembly may be tested for an electrical characteristic; and
    said programmable means operable to test a predetermined electrical characteristic of a positioned component.

11. A device for assembling electrical components having extending leads onto a circuit board in which the leads pass through holes in the board and are cut and clinched on the underside of the board comprising:
    cutter assembly means positioned adjacent the underside of the board including;
    cutter means positioned to cut and bend a lead passing through a board;
    said cutter means including a movable cutter blade in which the extent of movement determines the angle of bend of a cut lead;
    adjustable cutter blade a predetermined distance over a range of distances moving means to move the cutter blade to cut a component lead; and
    programmable means to control the adjustable cutter blade moving means to move the cutter blade predetermined distances over said range of distances for successive components to determine the angle of bend of the respective component leads.

12. A device as set forth in claim 11 in which the cutter assembly means includes two cutter means positioned to cut and bend two component leads passing through a board and each cutter means includes a movable cutter blade and a fixed cutter blade which cooperate to cut a component lead.

13. A device for assembling electrical components having extending leads onto a circuit board in which the leads pass through holes in the board and are cut and clinched on the underside of the board comprising:
    cutter assembly means positioned adjacent the underside of the board including;
    cutter means positioned to cut and bend a lead passing through a board;
    adjustable means to move the cutter means toward and away from the board whereby the distance from the underside of the board to the cutter means determines the length of a cut lead; programmable means to control the adjustable means to move the cutter means predetermined distances over a range of distances for successive components to determine the cut lengths of the respective component leads.

14. The set forth in claim 13 in which the cutter assembly includes pin means passing through the cutter assembly to engage the underside of the circuit board; and
    said pin means being fixedly mounted.

15. A device for assembling electrical components having extending leads onto a circuit board in which the leads pass through holes in the board and are cut and clinched on the underside of the board comprising:
    cutter assembly means positioned adjacent to the underside of the board including;
    cutter means positioned to cut and bend a lead passing through a board;

said cutter means including a movable cutter blade to which the extent of movement determines the angle of bend of a cut lead;

cutter blade moving means to move the cutter blade to cut a component lead;

means to move the cutter means toward and away from the board whereby the distance from the underside of the board to the cutter means determines the length of a cut lead;

component testing means adapted to test an electrical characteristic of successive components as they are mounted on the circuit board;

electrical conducting means connected to the testing means and to the cutter assembly means;

programmable computer means connected to the testing means to control the testing means to measure a predetermined electrical characteristic of each of a series of components as they are mounted on the circuit board; and means responsive to the testing means to indicate the result of the test of each component.

* * * * *